(12) United States Patent
Wang et al.

(10) Patent No.: US 7,336,098 B2
(45) Date of Patent: Feb. 26, 2008

(54) HIGH SPEED MEMORY MODULES UTILIZING ON-PIN CAPACITORS

(75) Inventors: Brian Bai-Kuan Wang, Folsom, CA (US); Ge Chang, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 235 days.

(21) Appl. No.: 10/882,626

(22) Filed: Jun. 30, 2004

(65) Prior Publication Data
US 2006/0001443 A1 Jan. 5, 2006

(51) Int. Cl.
*H03K 19/177* (2006.01)
*G11C 5/06* (2006.01)

(52) U.S. Cl. ............... 326/40; 365/185.11; 365/185.05; 365/63; 711/5

(58) Field of Classification Search ............ 326/30, 326/26, 40; 365/51, 52, 63, 185.11, 185.05; 361/783
See application file for complete search history.

(56) References Cited

U.S. PATENT DOCUMENTS

| 5,638,402 | A | * | 6/1997 | Osaka et al. ............ 375/257 |
| 5,955,889 | A | * | 9/1999 | Taguchi et al. ............ 326/30 |
| 6,522,165 | B2 | * | 2/2003 | Ramachandran et al. ...... 326/30 |
| 6,745,268 | B1 | | 6/2004 | Greeff et al. |
| 2003/0043683 | A1 | * | 3/2003 | Funaba et al. ......... 365/230.03 |
| 2003/0223290 | A1 | | 12/2003 | Park et al. |
| 2004/0071040 | A1 | * | 4/2004 | Funaba et al. ............ 365/232 |
| 2004/0125635 | A1 | * | 7/2004 | Kuzmenka ................ 365/51 |
| 2004/0215990 | A1 | * | 10/2004 | Allen et al. ............ 713/320 |
| 2005/0050285 | A1 | * | 3/2005 | Haas et al. ............ 711/162 |
| 2006/0002165 | A1 | * | 1/2006 | Chang et al. ............ 365/63 |

FOREIGN PATENT DOCUMENTS

JP 07321828 8/1995

* cited by examiner

*Primary Examiner*—Daniel Chang
(74) *Attorney, Agent, or Firm*—Blakely, Sokoloff, Taylor & Zafman LLP

(57) ABSTRACT

Apparatus and method for producing memory modules having a plurality of branches connected to a memory bus, each branch containing at least one dynamic random access memory (DRAM) device or SDRAM device connected to the memory bus via at least one transmission signal (TS) line and/or at least one sub-transmission signal (STS) line. The memory modules include at least one branch containing a capacitor connected in parallel to the TS line or STS line and the DRAM device or SDRAM device. A computing system implementing the memory modules is also discussed.

26 Claims, 5 Drawing Sheets

500

```
┌─────────────────────────────────────────────┐
│  FABRICATING A PRINTED CIRCUIT BOARD HAVING │
│   A PLURALITY OF TRANSMISSION SIGNAL (TS)   │
│   LINES AND/OR PLURALITY OF SUB-TRANSMISSION│
│              SIGNAL (STS) LINES             │
│                     510                     │
└─────────────────────────────────────────────┘
                      │
                      ▼
┌─────────────────────────────────────────────┐
│   COUPLING AT LEAST ONE DYNAMIC RANDOM      │
│   ACCESS MEMORY (DRAM) DEVICE OR SYNCHRONOUS│
│   DYNAMIC RANDOM ACCESS MEMORY (SDRAM)      │
│   DEVICE TO AT LEAST ONE OF THE PLURALITY   │
│   OF TS LINES AND/OR STS LINES, THE TS LINES│
│   AND/OR STS LINES ALSO CONNECTED TO A      │
│   MEMORY BUS, ONE TS LINE AND/OR STS LINE   │
│   CONTAIN A CAPACITOR CONNECTED IN PARALLEL │
│   WITH A FIRST DRAM DEVICE OR SDRAM DEVICE  │
│                     520                     │
└─────────────────────────────────────────────┘
                      │
                      ▼
┌─────────────────────────────────────────────┐
│  CONNECTING ONE OR MORE ADDITIONAL CAPACITORS│
│  IN PARALLEL WITH ONE OR MORE ADDITIONAL    │
│  DRAMS OR SDRAMS ON ONE OR MORE ADDITIONAL  │
│            TS LINES AND/OR STS LINES        │
│                     530                     │
└─────────────────────────────────────────────┘
```

FIG. 5

HIGH SPEED MEMORY MODULES UTILIZING ON-PIN CAPACITORS

BACKGROUND

1. Field

Memory modules

2. Background

Computing systems are comprised of a set of components that communicate with each other over buses and similar communication lines. Computing system components include processors, communication chipsets, memory modules, peripheral components and similar devices. These devices communicate with one another over a set of buses. These buses may utilize communication protocols understood by each of the components on the bus. Some components act as bus controllers to manage communication traffic on the bus.

Computing system speed and efficiency is limited by the speed of buses and communication lines in the computer system. A processor relies on a system bus, memory bus and memory controller to retrieve data and instructions from system memory. The processor is limited in the speed at which it can process these instructions by the speed at which it can receive the data and instructions over the system bus and memory bus from system memory.

Buses are typically communication lines laid out on a printed circuit board (PCB) such as the main board of a computing system. Components (e.g., memory) in the computing system have pins that connect to the lines of the bus. The components communicate across the bus by driving a signal across lines of the bus. These signals are latched by a recipient device. If a signal is not properly terminated, a reflection of the signal may occur or other noise may affect subsequent signaling on the line.

BRIEF DESCRIPTION OF THE DRAWINGS

FIG. 5 is a flow diagram of one embodiment of a method to produce the memory modules of FIG. 1, FIG. 2 and FIG. 3.

DETAILED DESCRIPTION

Figure 1:
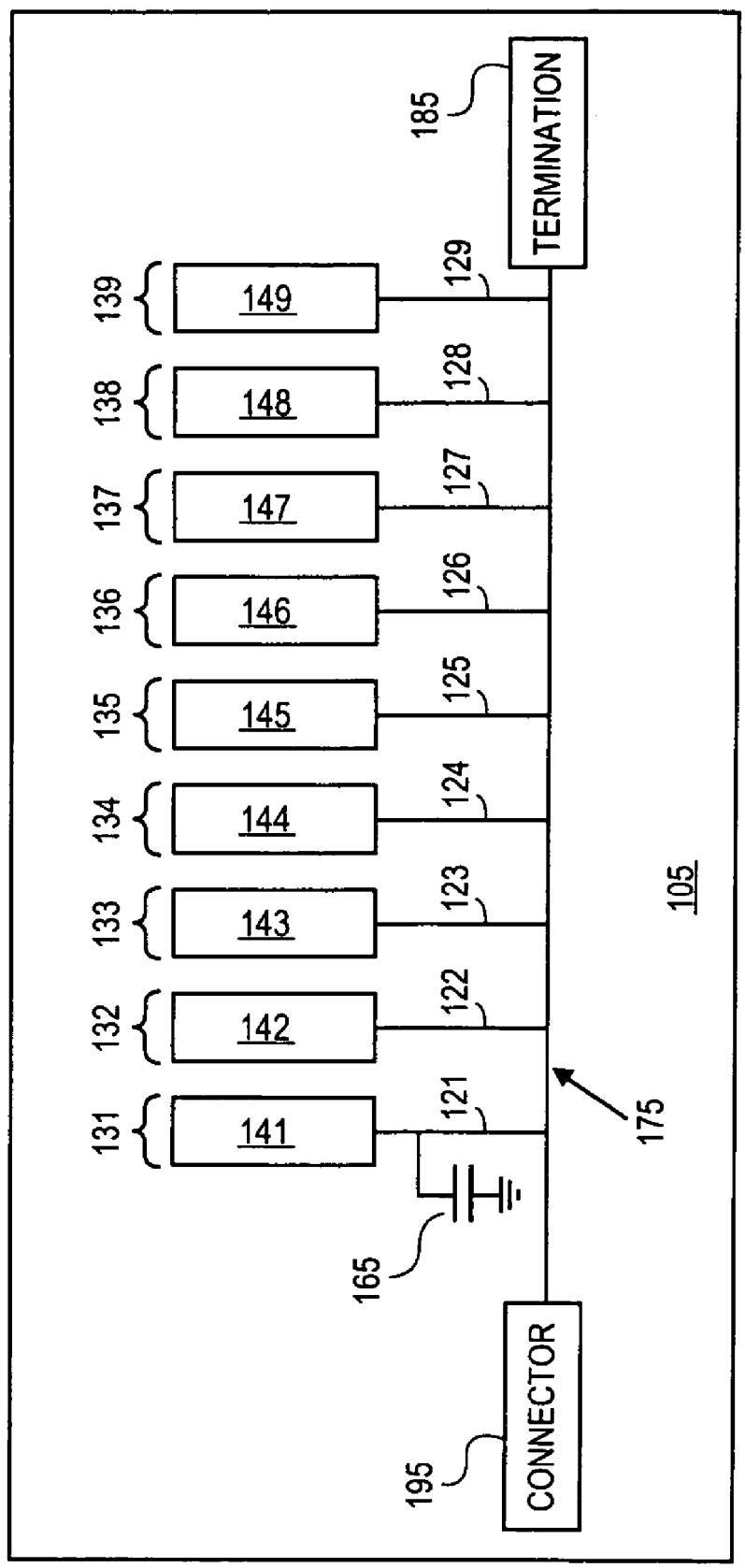
FIG. 1 is a block diagram of one embodiment of a memory module containing at least one capacitor in parallel with a dynamic random access memory (DRAM) device and a transmission signal (TS) line connected to a memory bus.

FIG. 1 is a block diagram of one embodiment of a memory module containing at least one capacitor in parallel with a dynamic random access memory (DRAM) device and a transmission signal (TS) line connected to a memory bus. Memory module 100, in the embodiment shown in FIG. 1, is a single in-line memory module (SIMM).

In one embodiment, memory module 100 is formed on printed circuit board (PCB) 105. PCB 105 may be formed utilizing any method to form printed circuit boards or other types of circuit boards known in the art. In one embodiment, memory module 100 includes TS lines 121 through 129 formed on PCB 105.

In the embodiment shown in FIG. 1, the pattern on PCB 105 includes memory bus 175 connected to TS lines 121 through 129. In other embodiments, memory module 100 may include any pattern for TS lines 121 through 129 and memory bus 175.

In one embodiment, TS lines 121 through 129 and memory bus 175 are formed of copper. In other embodiments, TS lines 121 through 129 and memory bus 175 may be formed of other conductive materials known in the art.

In one embodiment, memory bus 175 includes termination circuit 185 located after the attachment point of TS line 129 on memory bus 130 and opposite connector 195, which connects memory module 100 to other components of a computing system. In an embodiment, termination circuit 185 is connected to a voltage source to form a pull-up termination circuit. In another embodiment, termination circuit 185 is connected to ground to form a pull-down termination circuit.

Memory module 100, in one embodiment, includes DRAM devices 141 through 149. DRAM devices 141 through 149, in one embodiment, are each connected to a respective TS line, which, as discussed above, is connected to memory bus 175 to form branches 131 through 139. DRAM devices 141 through 149 may each be any DRAM device or other memory device known in the art capable of having data written to and read from it by a computing system. In the embodiment shown in FIG. 1, memory module 100 contains nine DRAM devices and branches, however, memory module 100 may contain any number of DRAM devices and branches.

In one embodiment, memory module 100 also includes capacitor 165. Capacitor 165, in an embodiment, is connected in parallel with DRAM device 141 and TS 121. Capacitor 165, in one embodiment, is a four picofarad (pF) capacitor. In other embodiments, capacitor 165 is a capacitor in the range of about one pF to about 40 pF.

Memory module 100, in one embodiment, has a second capacitor connected in parallel DRAM device 141 and TS line 121. Likewise, this second capacitor may have a capacitance in the range of about one pF to about 40 pF.

In other embodiments, memory module 100 contains a plurality of capacitors similar to capacitor 165 connected in parallel with a respective DRAM device and a subset of TS lines connected to memory bus 175. In this instance, a subset is one or more TS lines (e.g., TS lines 121, 122) having a capacitor connected in parallel with each DRAM device (e.g., DRAM devices 141, 142) and TS line connected to memory bus 175. In one embodiment, the subset includes TS lines 121 through 129 each having at least one capacitor similar to capacitor 165 connected in parallel to it and each of DRAM devices 141 through 149 to form a plurality of branches similar to branch 131. In one embodiment, the plurality of capacitors are the same size. In other embodiments, at least two of the plurality of capacitors are different sizes.

Figure 2:
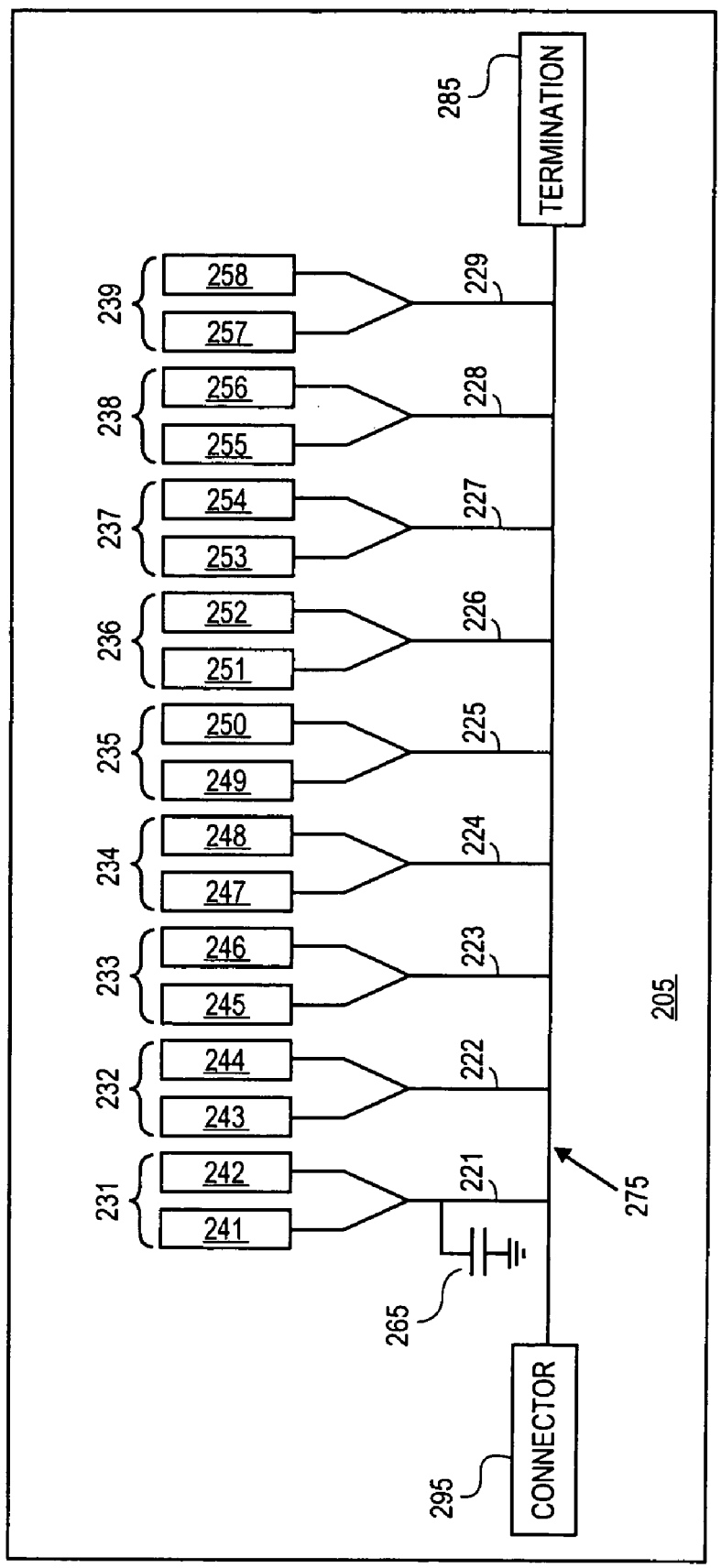
FIG. 2 is a block diagram of an embodiment of a memory module containing at least one capacitor connected in parallel with at least one synchronous random access memory (SDRAM) device and a TS line connected to a memory bus.

FIG. 2 is a block diagram of an embodiment of a memory module containing at least one capacitor connected in parallel with at least one synchronous random access memory (SDRAM) device and a TS line connected to a memory bus. Memory module 200, in the embodiment shown in FIG. 2, is a double in-line memory module (DIMM).

In one embodiment, memory module 200 is formed on PCB 205 similar to the embodiments discussed above with regard to FIG. 1. Likewise, in one embodiment, memory module 200 includes TS lines 221 through 229 and memory bus 275, including termination circuit 285 and connector 295, on PCB 205.

Memory module 200, in one embodiment, includes SDRAM devices 241 through 258. SDRAM devices 241 through 258 may be any SDRAM device known in the art capable of having data written to and read from it by a computing system. In other embodiments, SDRAM devices 241 through 258 may be replaced with DRAM devices similar to DRAM devices 141 through 149 discussed above or other memory devices known in the art capable of having data written to and read from it by a computing system. SDRAM devices 241 through 258, in one embodiment, are divided into pairs (e.g., SDRAM devices 241, 242; SDRAM devices 243, 244; etc.) and each pair is connected to one of TS lines 221 through 229, respectively, to form branches 231 through 239 consisting of two SDRAM devices and a single TS line.

In the embodiment shown in FIG. 2, memory module 200 contains 18 SDRAM devices forming nine branches, however, memory module 200 may contain any number of SDRAM devices and branches. In addition, in other embodiments, a branch may contain more than two SDRAM devices.

In one embodiment, memory module 200 includes capacitor 265. Capacitor 265, in an embodiment, is connected in parallel with SDRAM devices 241, 242 and TS line 221. In addition, capacitor 265, in one embodiment, is a four pF capacitor. In other embodiments, capacitor 265 may be a capacitor in the range of about one pF to about 40 pF.

In one embodiment, memory module 200 may have more than one capacitor connected in parallel to TS line 221 and SDRAM devices 241, 242. For example, TS line 221 may have two capacitors connected in parallel with SDRAM devices 241, 242 and TS line 221. Likewise, this second capacitor may have a capacitance in the range of about one pF to about 40 pF.

In other embodiments, memory module 200 contains a plurality of capacitors similar to capacitor 265 connected in parallel with a pair of SDRAM devices and a subset of TS lines connected to memory bus 275. A subset, in this regard, is one or more TS lines (e.g., TS line 221 and TS line 222) having at least one capacitor connected in parallel with a pair of SDRAM devices (e.g., SDRAM devices 241, 242 and SDRAM devices 243, 244) on each of the TS lines connected to memory bus 275. Moreover, a subset, in one embodiment, includes each TS line (e.g., TS lines 221 through 229) having a capacitor similar to capacitor 265 connected in parallel with each respective pair of SDRAM devices on each TS line to form a plurality of branches similar to branches 231, 232. In one embodiment, the plurality of capacitors are the same size. In other embodiments, at least two of the plurality of capacitors are different sizes.

Figure 3:
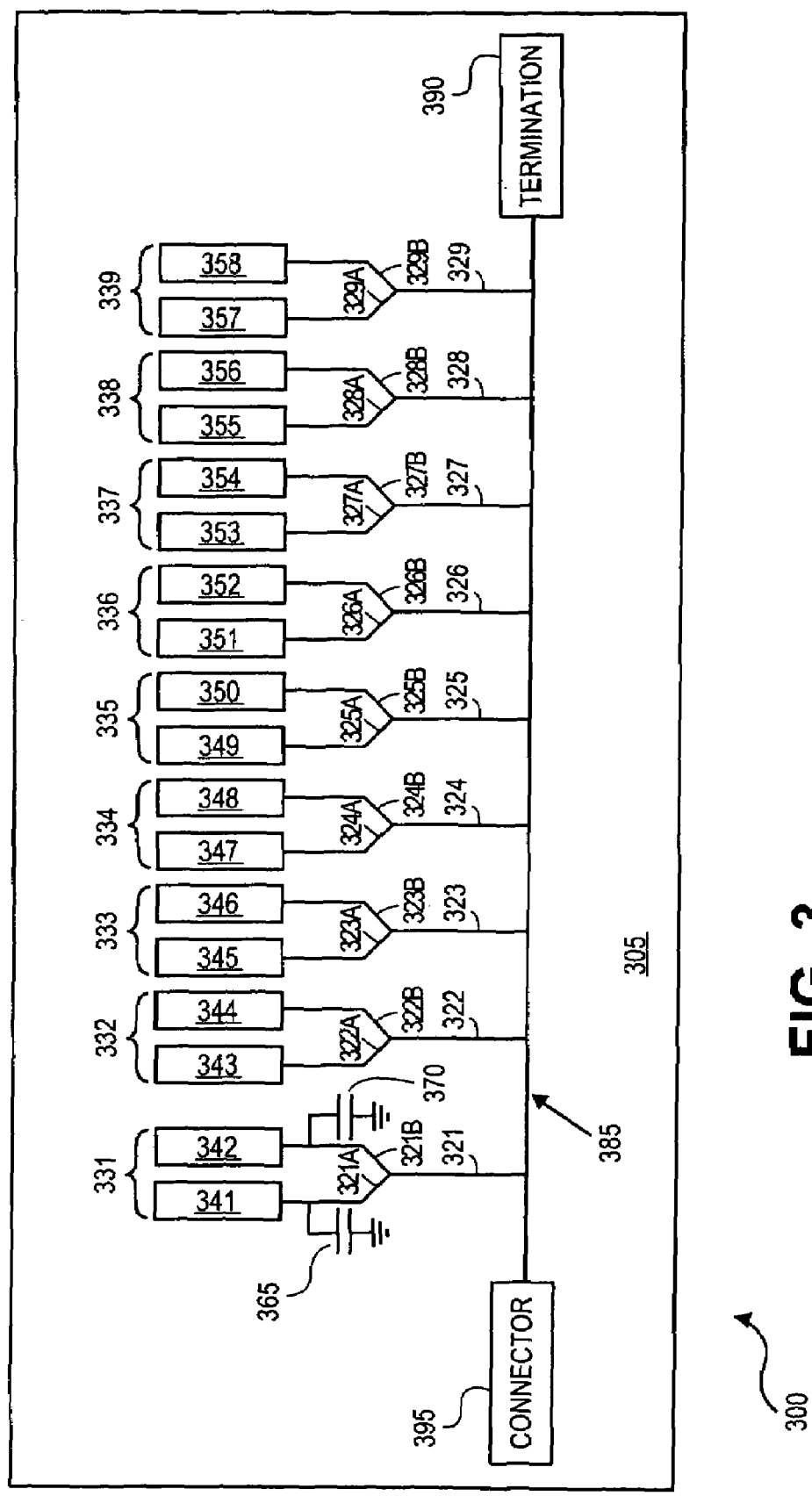
FIG. 3 is a block diagram of one embodiment of a memory module containing at least one capacitor connected in parallel with at least one SDRAM device and a sub-transmission signal (STS) line connected to a memory bus.

FIG. 3 is a block diagram of one embodiment of a memory module containing at least one capacitor connected in parallel with at least one SDRAM device and at least one sub-transmission (STS) line connected to a memory bus. Memory module 300, in the embodiment shown in FIG. 3, is a DIMM including branches 331 through 339 (containing TS lines 321 through 329 connected to SDRAM devices 341 through 358, respectively) connected to memory bus 385, including termination circuit 390 and connector 395, similar to the embodiments discussed above with regard to FIG. 2.

In one embodiment, memory module 300 contains STS lines 321A, 321B through 329A, 329B connected to TS lines 321 through 329 and SDRAM devices 331 through 339, respectively. In the embodiment shown in FIG. 3, memory module 300 contains capacitors 365, 370 similar to capacitor 265 discussed above, connected to STS lines 321A, 321B, respectively. In one embodiment, capacitors 365, 370 are the same size. In other embodiments, capacitors 365, 370 are different sizes.

In one embodiment, memory module 300 may have more than one capacitor coupled to one or each of STS lines 321A, 321B and in parallel with SDRAM devices 341, 342. For example, STS line 221A may have two capacitors connected in parallel with SDRAM device 341 and STS line 321A. Likewise, this second capacitor may have a capacitance in the range of about one pF to about 40 pF. In one embodiment, each capacitor is the same size. In other embodiments, at least two capacitors are different sizes.

Memory module 300, in one embodiment, contains a plurality of capacitors similar to capacitors 365, 370 connected in parallel to a subset of STS lines within a single branch, each also in parallel with a respective SDRAM device. A subset, in this regard, is at least one pair of STS lines (e.g., STS lines 321A, 321B and STS lines 322A, 322B) having at least one capacitor connected to each STS line, each capacitor in parallel with a SDRAM device (e.g., SDRAM devices 341, 342, 343, 344). Moreover, a subset, in one embodiment, includes each STS line (e.g., STS lines 321A, 321B through 329A, 329B) having a capacitor similar to capacitors 365, 370 connected in parallel with each respective SDRAM device and the STS line to form a plurality of branches similar to branches 331. In one embodiment, the plurality of capacitors are the same size. In other embodiments, at least two of the plurality of capacitors are different sizes.

In addition, in one embodiment, a single branch (e.g., branch 331) has only one capacitor (e.g., capacitor 365) connected in parallel with one of the STS lines (e.g., STS line 321A) while the other STS line (e.g., STS line 321B) does not have a capacitor connected to it. Moreover, it is contemplated that memory module 300 may have any combination of a plurality of capacitors located on at least one STS line and at least one TS line, whether the STS line and TS line be within the same branch or on different branches. For example, in one embodiment, STS lines 321A, 321B each have at least one capacitor connected in parallel to them and TS line 322 also has at least one capacitor connected in parallel to it.

In addition, since "A" and "B" STS lines are in parallel, capacitors 365, 370, for example, in one embodiment, are half as large as, for example, capacitor 265 discussed above to achieve a similar amount of capacitance within branch 331 as contained within branch 221. This, likewise, applies to any pair of capacitors connected in parallel on the STS lines discussed above.

Figure 4:
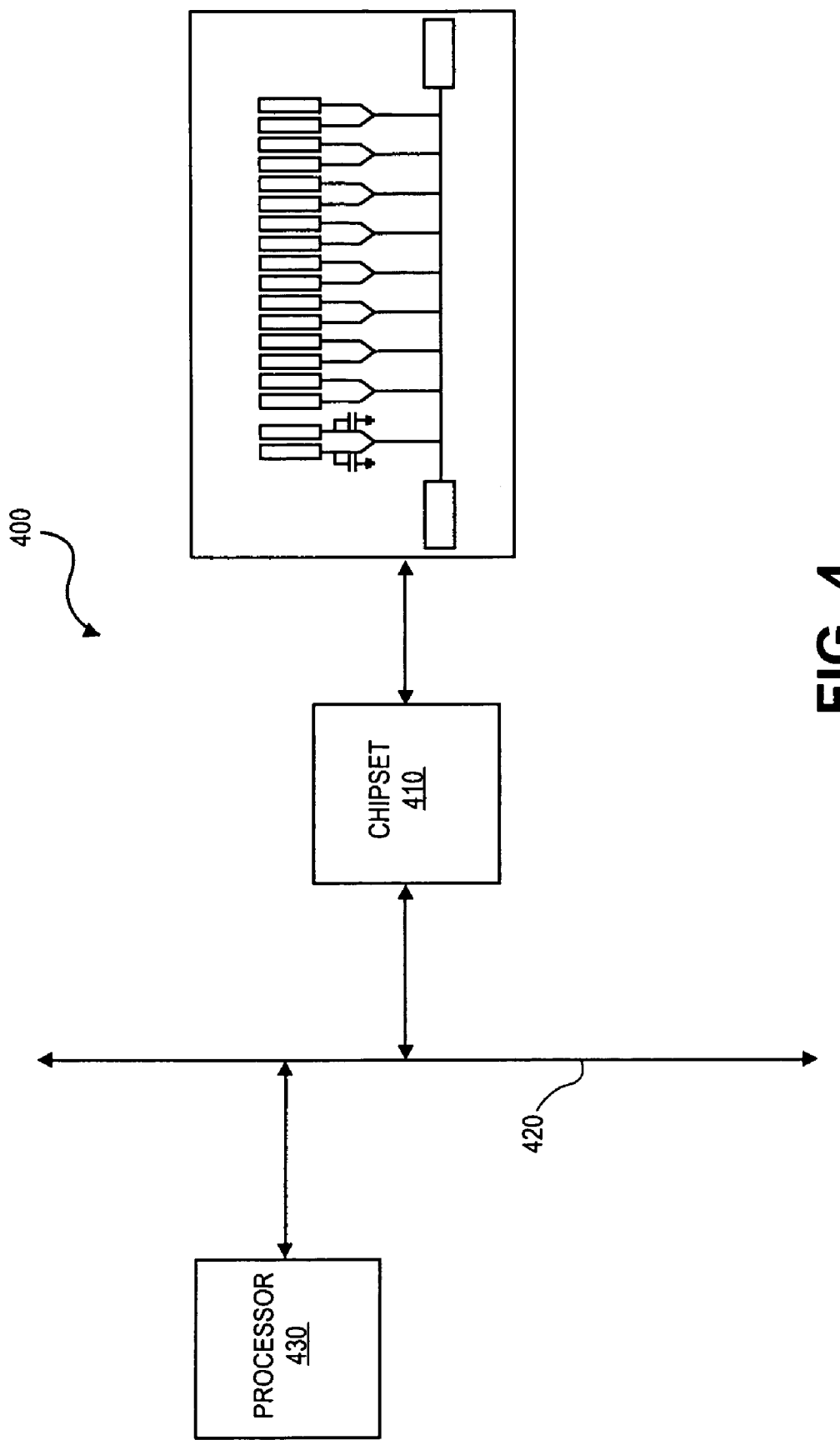
FIG. 4 is a block diagram of one embodiment of a computing system containing the memory module of FIG. 2.

FIG. 4 is a block diagram of one embodiment of a computing system containing the memory module of FIG. 2. Computing system 400, in the embodiment shown in FIG. 4, contains memory module 405 similar to memory module 200 discussed above connected to chipset 410. In other embodiments, memory module 405 is similar to memory module 100 or memory module 300 discussed above.

Chipset 410 may be any communication hub known in the art capable of facilitating computing transactions. In one embodiment, chipset 410 is connected to system bus 420. System bus 420 may be any system bus known in the art capable of transmitting computing transactions.

In one embodiment, system bus 420 is connected to processor 430. Processor 430, in one embodiment, is a Pentium 4 processor manufactured by Intel Corporation of Santa Clara, Calif. In other embodiments, processor 430 may be any processor known in the art.

FIG. 5 is a flow diagram of one embodiment of a method to produce the memory modules of FIG. 1, FIG. 2 and FIG. 3. Method 500, in one embodiment, begins by fabricating a PCB containing a plurality of TS lines and/or STS lines (block 510). The TS lines and/or STS lines may form any pattern on the PCB.

In one embodiment, a plurality of DRAM devices or SDRAM devices are connected to the plurality of TS lines and/or STS lines, the TS lines and/or STS lines are also connected to a memory bus, one TS line and/or STS line containing a capacitor connected in parallel with a first DRAM device or first SDRAM device (block 520). Method 500, in one embodiment, also includes connecting at least one additional capacitor to a subset of additional TS lines and/or STS lines, similar to the embodiments discussed above, connected in parallel with the TS lines and/or STS lines and DRAM devices and SDRAM devices (block 530).

In the preceding paragraphs, specific embodiments are described. It will, however, be evident that various modifications and changes may be made thereto without departing from the broader spirit and scope of the claims. The specification and drawings are, accordingly, to be regarded in an illustrative rather than a restrictive sense.

We claim:

1. An apparatus, comprising:
   a plurality of memory devices, each coupled to a memory bus via one of a plurality of transmission signal lines; and
   a first of at least one capacitor coupled to one of a first transmission signal line and a first sub-transmission signal line in parallel with and located adjacent to a first of the plurality of memory devices.

2. The apparatus of claim 1, wherein the plurality of memory devices are divided into pairs, each pair forming a branch.

3. The apparatus of claim 2, wherein the first at least one capacitor is in the range of about one picofarads (pF) to about 40 pF.

4. The apparatus of claim 2, wherein the first at least one capacitor is a four pF capacitor.

5. The apparatus of claim 2, further comprising:
   a second capacitor coupled to one of a second transmission signal (TS) line and a second sub transmission signal (STS) line in parallel with a second branch.

6. The apparatus of claim 5, wherein the first capacitor and the second capacitor are a substantially same size.

7. The apparatus of claim 6, wherein the first capacitor and the second capacitor are each in the range of about one pF to about 40 pF.

8. The apparatus of claim 5, wherein the first capacitor and the second capacitor are different sizes.

9. The apparatus of claim 8, wherein the first capacitor and the second capacitor are each in the range of about one pF to about 40 pF.

10. The apparatus of claim 2, further comprising:
    a first plurality of capacitors coupled in parallel with a first branch, the total capacitance on the first branch is in the range of about one pF to about 40 pF.

11. The apparatus of claim 2, further comprising:
    at least one capacitor coupled to each of one of a plurality of transmission signal lines and a plurality of sub-transmission signal lines, each capacitor in parallel with a respective memory device of the plurality of memory devices.

12. The apparatus of claim 11, wherein the total capacitance on each branch is in the range of about one pF to about 40 pF.

13. The apparatus of claim 1, wherein each of the plurality of memory devices forms a branch, and
    wherein the capacitance on a first branch is in the range of about one pF to about 40 pF.

14. The apparatus of claim 13, further comprising:
    at least one capacitor coupled to each of the plurality of transmission signal lines, each capacitor coupled in parallel with one memory device.

15. The apparatus of claim 14, wherein the capacitance on each transmission signal line is in the range of about one pF to about 40 pF.

16. The apparatus of claim 1, wherein the apparatus is one of a single printed circuit board (PCB), a single in-line memory module (SIMM), and a single dual inline memory module (DIMM).

17. The apparatus of claim 1, wherein the first of at least one capacitor is attached to the one of a first transmission signal line and a first sub-transmission signal line, and is attached between the memory bus and the memory device.

18. The apparatus of claim 1, wherein the plurality of memory devices are each coupled to control signal pins of the memory bus.

19. The apparatus of claim 1, further comprising a termination attached to one end of the bus and a PCB connector attached to an opposite end of the bus, wherein the apparatus is on a single PCB.

20. The apparatus of claim 1, further comprising a connector attached to an end of the bus, wherein the first of at least one capacitor is in parallel with the connector, a length of the bus, and the one of a first transmission signal line and a first sub-transmission signal line.

21. A system, comprising:
    a memory package comprising:
       a plurality of memory devices coupled to a memory bus via a plurality of transmission signal lines, and
       at least one capacitor coupled to a first transmission signal line, a first capacitor of the at least one capacitor in parallel with and located adjacent to a first memory device and in the range of about one picofarads (pF) to about 40 pF;
    a chipset coupled to the memory package; and
    a processor coupled to the chipset via a system bus.

22. The system of claim 21, wherein the memory package is on a dual in-line memory module.

23. The system of claim 22, wherein the memory package is on a single in-line memory module.

24. A method, comprising:
    fabricating a printed circuit board (PCB) containing one of a plurality transmission signal (TS) lines and a plurality of sub-transmission signal (STS) lines;
    coupling one or more memory devices to at least one of the plurality of TS lines and the plurality of STS lines, each of the one of the plurality of TS lines and the plurality of STS lines also coupled to a memory bus, and one of a first TS line and a first STS line including a first capacitor in the range of about one picofarads (pF) to about 40 pF connected in parallel with each of the plurality of memory devices.

25. The method of claim 24, further comprising:
coupling a second capacitor in parallel with a second memory device on one of a second TS line and a second STS line.

26. The method of claim 24, further comprising:
coupling at least one capacitor in parallel with a respective memory device on each of the one of the plurality of TS lines and the plurality of STS lines.

* * * * *